United States Patent [19]
Chang et al.

[11] Patent Number: 6,000,130
[45] Date of Patent: Dec. 14, 1999

[54] PROCESS FOR MAKING PLANAR REDISTRIBUTION STRUCTURE

[75] Inventors: Chi Shih Chang, Austin, Tex.; Frank Daniel Egitto, Binghamton, N.Y.

[73] Assignee: International Business Machines Corporation, Armonk, N.Y.

[21] Appl. No.: 09/062,816

[22] Filed: Apr. 20, 1998

Related U.S. Application Data

[62] Division of application No. 08/697,655, Aug. 28, 1996, Pat. No. 5,774,340.

[51] Int. Cl.$^6$ ........................................................ H01K 3/10
[52] U.S. Cl. .................................. 29/852; 29/830; 29/840
[58] Field of Search ............................. 29/825, 827, 852, 29/830, 846, 840; 428/421; 174/261

[56] References Cited

U.S. PATENT DOCUMENTS

| | | |
|---|---|---|
| 4,489,364 | 12/1984 | Chance et al. . |
| 4,849,284 | 7/1989 | Arthur et al. . |
| 4,854,038 | 8/1989 | Wiley ........................................ 29/830 |
| 4,868,350 | 9/1989 | Huffarth et al. ...................... 29/830 X |
| 4,895,752 | 1/1990 | McEwen . |
| 4,912,603 | 3/1990 | Seyama . |
| 5,010,641 | 4/1991 | Sisler ........................................ 29/830 |
| 5,061,548 | 10/1991 | Arthur et al. . |
| 5,097,593 | 3/1992 | Jones et al. . |
| 5,149,590 | 9/1992 | Arthur et al. . |
| 5,194,713 | 3/1993 | Egitto et al. . |
| 5,232,548 | 8/1993 | Ehrenberg et al. . |
| 5,243,140 | 9/1993 | Bhatia et al. . |
| 5,294,754 | 3/1994 | Wu . |
| 5,358,775 | 10/1994 | Horn, III . |
| 5,367,435 | 11/1994 | Andros et al. . |
| 5,384,181 | 1/1995 | Arthur et al. . |
| 5,401,909 | 3/1995 | Arnold et al. . |
| 5,418,689 | 5/1995 | Alpaugh et al. . |
| 5,424,492 | 6/1995 | Petty et al. . |
| 5,473,813 | 12/1995 | Chobot et al. ........................ 29/830 X |
| 5,578,525 | 11/1996 | Mizukoshi . |
| 5,615,089 | 3/1997 | Yoneda et al. . |
| 5,736,679 | 4/1998 | Kresge et al. ........................ 29/830 X |

OTHER PUBLICATIONS

IBM technical Disclosure Bulletin; "Microstructured Solder Mask by Means of Laser Ablation", vol. 36, No. 11 Nov. 1993. pp. 589–590.

*Primary Examiner*—Carl J. Arbes
*Attorney, Agent, or Firm*—William N. Hogg

[57] ABSTRACT

A self-supporting redistribution structure for directly mounting a semi-conductor chip to a multilayer electronic substrate is separately fabricated and then laminated to the multilayer substrate. The redistribution structure comprises a dielectric layer having plated vias communicating between its two major surfaces, redistribution lines and input/output pads on its upper major surface and joining patterns on its lower margin surface for electrical connection with the multilayer substrate. The metal plating in the plated vias of the redistribution device connects respective input/output pads on the upper surface of the redistribution structures with the joining patterns on its lower major surface. Input/output pads define an even (planar) topography with the redistribution lines to facilitate flip chip joining.

13 Claims, 3 Drawing Sheets

PROCESS FOR MAKING PLANAR REDISTRIBUTION STRUCTURE

RELATED APPLICATIONS

This is a Divisional of copending patent application Ser. No. 08/697,655 filed Aug. 28, 1996 now U.S. Pat. No. 5,774,340.

BACKGROUND OF THE INVENTION

The present invention relates to a planar redistribution device or structure for directly attaching an integrated circuit chip or chips to a printed circuit board or card. In addition, the present invention also relates to a process for fabricating such a planar redistribution device.

With the advent of relatively large, high performance integrated circuit systems, continuing efforts are underway to optimize packaging topology. One way of accomplishing this is to form a printed circuit board or card by laminating together one or more signal layers and one or more power planes or cores and then directly attaching one or more semiconductor chips to the laminate so formed thereby forming a completed chip carrier. Because the electrical contacts or bumps on a typical semiconductor chip are so close together, it is usually necessary to interpose some form of redistribution structure between the chip and the printed circuit board or card for expanding the areas over which electrical contacts between the chips and the printed circuit board or card are made. For example, see U.S. Pat. No. 5,418,689, to Alpaugh et al., the disclosure of which is incorporated herein by reference.

In manufacturing devices such as illustrated in the above noted Alpaugh et al. patent, the individual signal layers and power planes are first produced and tested. Those meeting specifications are then laminated together to form a substrate. Thereafter, a redistribution device is built up thereon by means of a step-by-step operation using conventional printed circuit board manufacturing techniques. After optional testing again to see if specifications are met, the semiconductor chip or chips are mounted thereon.

With the ever increasing demands for improved reliability and better performance at lower cost, there still exists a need for improved designs and manufacturing techniques for producing direct mounted printed wiring devices.

SUMMARY OF THE INVENTION

In accordance with the present invention, one or more semiconductor chips is directly attached to a printed wiring device by means of a planar redistribution structure which is fabricated separately from, and preferably in tandem with, manufacture of the substrate of the printed wiring device. Thereafter, the inventive redistribution structure is laminated to the substrate of the printed wiring device to thereby form a completed circuit board or card suitable for direct attachment of a semiconductor chip.

Because the inventive planar redistribution structure is separately formed from the substrate of the printed wiring device, its joining patterns for electrical connection to signal layers, power layers and ground planes in the substrate can be tailored to match the electrical contacts in the substrate for improved electrical connection thereto. At the same time, the surface of the inventive redistribution structure intended for receipt of the semiconductor device can also be tailored to match the area array of the input/output pads of the semiconductor device, which also facilitates good electrical connection.

Furthermore, separate manufacture of the inventive redistribution device allows such manufacture to occur in parallel or tandem with manufacture of the multi-layer substrate of the printed wiring device. This speeds manufacture, since sequential manufacture of the redistribution structure on an already-completed multi-layer substrate is avoided. This also leads to less waste and better yields, since off-specification redistribution structures can be discovered and discarded before they are combined with on-specification multi-layer substrates.

BRIEF DESCRIPTION OF THE DRAWINGS

The present invention may be more easily understood by reference to the following drawings wherein.

DETAILED DESCRIPTION

Figure 1:
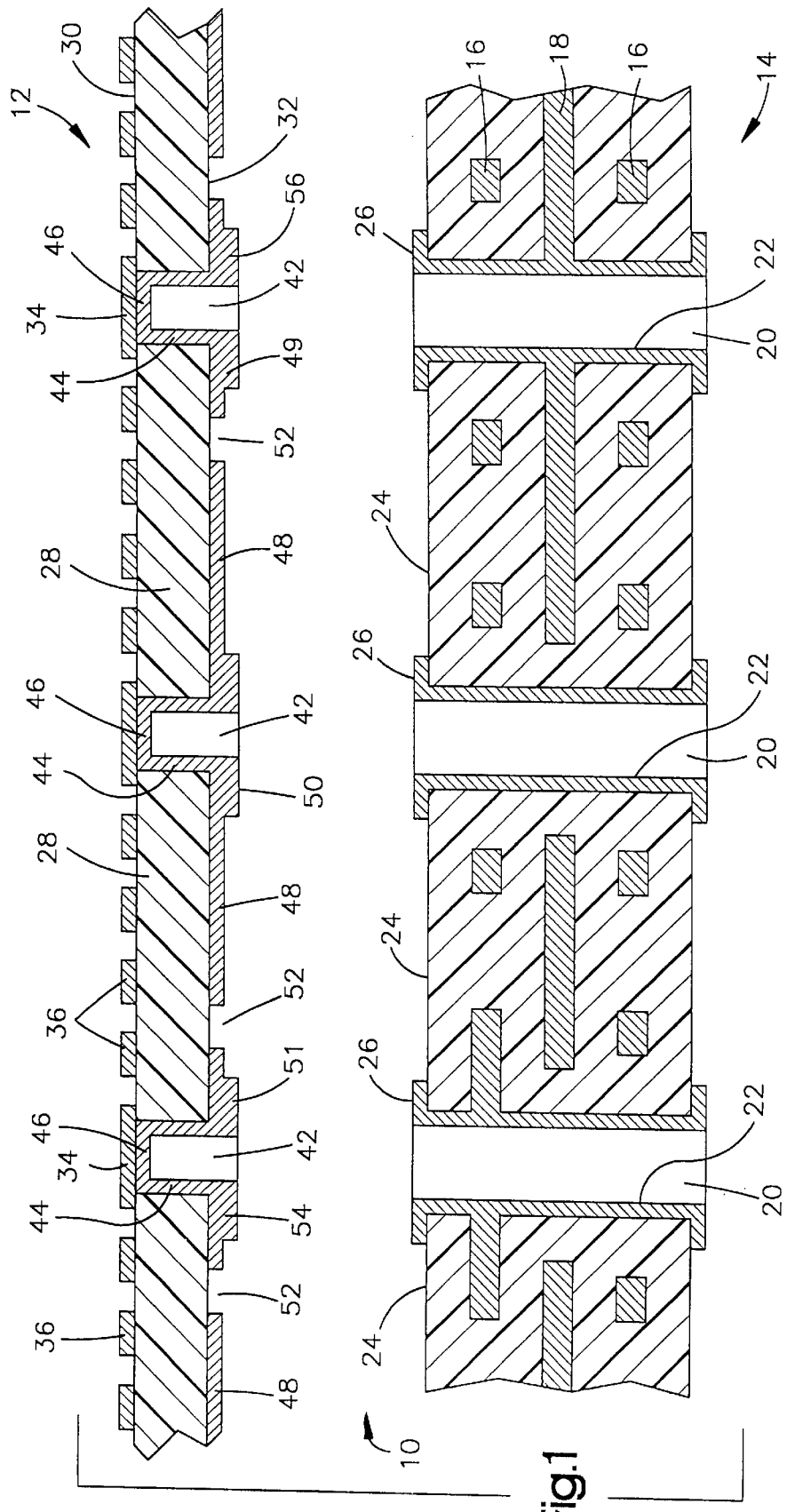
FIG. 1 is a schematic, exploded view illustrating the planar redistribution structure of the present invention in juxtaposition with a multi-layer substrate to which the inventive planar redistribution structure will subsequently be laminated to form a printed wiring device such as a printed circuit board or card in accordance with the present invention.

Referring to FIG. 1, a printed wiring device such as a printed circuit board or card generally indicated at 10 is composed of a self-supporting planar redistribution structure 12 made in accordance with the present invention and a multi-layer substrate 14.

Multi-layer substrate 14 is a laminate composed of two signal layers 16 and one power plane or core 18 laminated together to form a coherent composite. Plated-through-holes 20 are provided in substrate 14 for electrical connection to various electronic devices, not shown. The interior surfaces of plated-through-holes 20 are provided with layers of metal plating 22 which extend past top surface 24 of printed wiring device 14 thereby forming metal ridges 26 surrounding each plated-through-hole.

Figure 7:
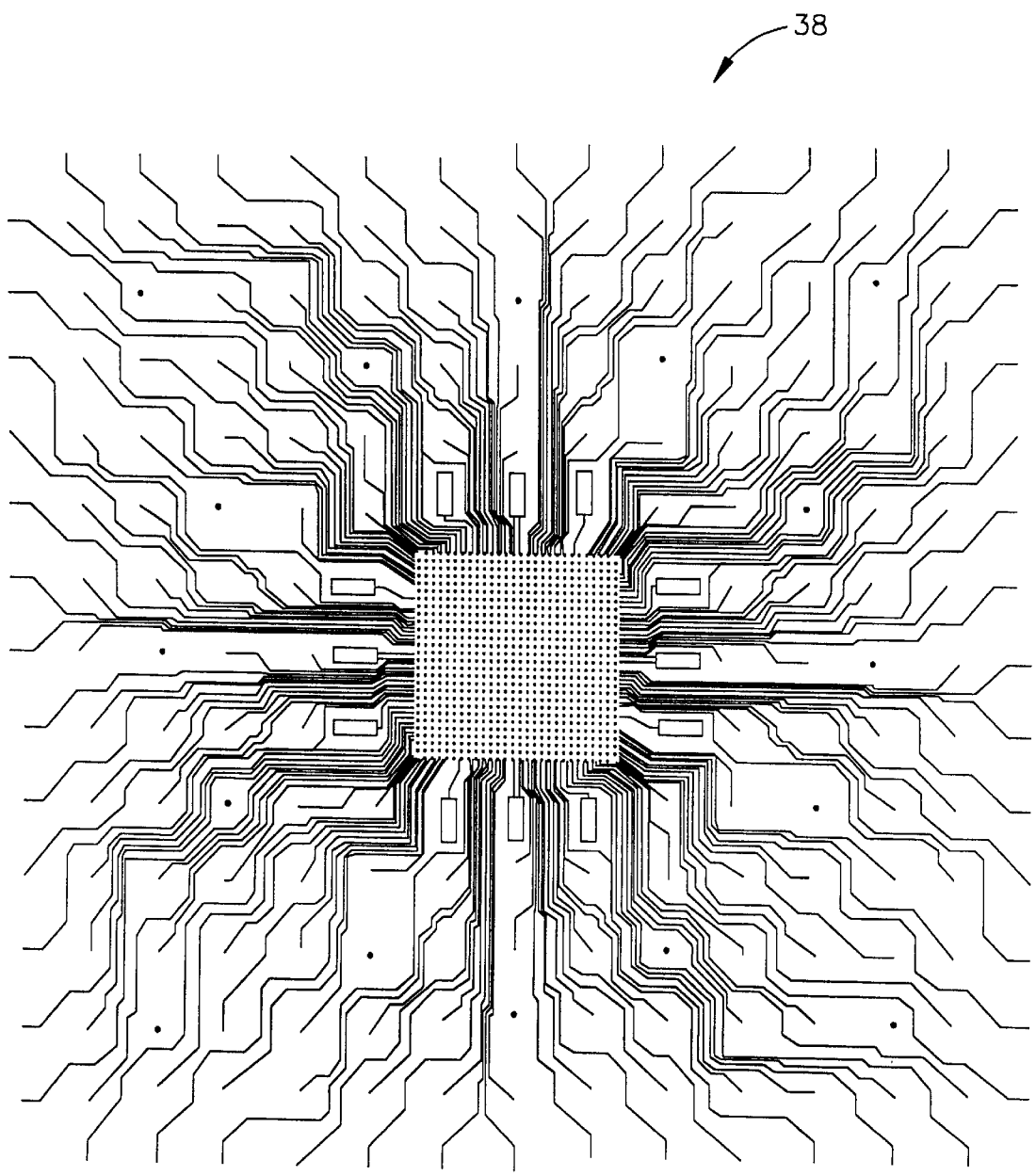
FIG. 7 illustrates a typical arrangement for signal connections from a chip pattern that is achievable in accordance with the present invention.

Inventive planar redistribution structure 12 is composed of a dielectric layer or sheet 28 having an upper or first major surface 30, a lower or second major surface 32 and multiple vias or openings 42 communicating between these two surfaces. First major surface 30 carries input/output pads 34 and redistribution lines 36. In the particular embodiment shown, input/output pads 34 cover each of vias 42 and are also larger in diameter than vias 42. Also, redistribution lines 36 are arranged in a fan-out pattern as illustrated generally at 38 in FIG. 7 for redistributing signals from and to semiconductor chip in area 40 to various electrical contacts in printed wiring device 14.

In the particular embodiment shown, input/output pads 34 define an even topography with redistribution lines 36 at upper surface 30 of planar redistribution structure 12. In other words, input/output pads 34 are substantially the same height as redistribution lines 36, whereby the upper surfaces of the signal redistribution lines and the input/output pads are essentially coplanar. This feature not only facilitates flip chip joining but also allows the contact pads and redistribution lines to be easily made by fine line lithography.

As shown in FIG. 1, vias 42 take the form of plated-through-holes in that the interior walls of vias 42 are provided with metal plating layers 44 thereon. Metal plating also extends over the closed tops of vias 42 to form top plating 46 which is in secure electrical contact with input/output pads 34 carried on upper major surface 30 of the inventive planar redistribution structure 12.

Lower or second major surface 32 of dielectric layer 28 carries ground plane 48 over a substantial portion of its entire surface area. When metal is deposited in vias 42 for forming metal plating layers 44 and tops 46, it is also allowed to deposit on ground plane 48 in the areas immediately adjacent the individual vias. This forms joining patterns 49, 50 and 51 on lower major surface 32, which joining patterns are in intimate electrical contact with metal plating layers 44 and top plating 46 of the vias.

As shown in FIG. 1, joining patterns 49, 50 and 51 are larger in lateral dimension than input/output pads 34 on upper major surface 30 of the redistribution structure. In the preferred embodiment, joining patterns 49, 50 and 51 approximately match metal ridges 26 on substrate 14 in overall lateral dimension This facilitates good electrical contact between planar redistribution structure 12 and substrate 14 when the two are laminated together.

As shown in FIG. 1, portions of ground plane 48 have been removed to form openings or breaks 52 therein. These breaks electrically insulate joining patterns 49 and 51 from the ground plane, joining patterns 49 and 51 thereby forming a power joining pattern for electrical connection to power plane 18 in substrate 14 and a signal joining pattern for electrical connection to one of the signal layers 16 in substrate 14, respectively.

The structure of the inventive planar redistribution structure leads to many advantages. For example, the even topology of input/output pads 34 and signal redistribution lines 36 facilitates flip chip joining as well as easy fabrication by simple fine line lithography. Also, the larger size of joining patterns 49, 50 and 51 relative to input/output pads 34 leads to excellent power and ground connections when the inventive redistribution structure is laminated to its multi-layer substrate. This not only improves fabrication yields, but also leads to minimum capacitive loadings on the signal lines. Also, because ground plane 48 is provided on lower major surface 32 of dielectric layer 28, redistribution lines 36 exhibit excellent $Z_o$ (characteristic impedance) control. Also, an essentially continuous ground plane imparts excellent dimensional stability to the inventive planar redistribution structure.

In a particular embodiment of the invention, dielectric layer 28 is made from a fluoropolymer based material, while input/output pads 34, redistribution lines 36, ground plane 48, joining patterns 49, 50 and 51 and metal plating layers 44 and 46 on vias 42 are all made from copper. In addition, dielectric layer 28 is made no more than 100 $\mu$m thick, preferably no more than 50 $\mu$m thick. With this structure, vias 42 can be easily formed by laser ablation using a $CO_2$ pulsed laser. In this embodiment, the pitch between the individual contact bumps of chip 40 can be about 250 $\mu$m, while the center-to-center pitch of vias 42 is substantially greater, preferably at least about twice as great as the pitch between these contact bumps. It can therefore be seen that the inventive planar redistribution structure, although very thin and easy to manufacture, nonetheless can receive and securely mount a chip while at the same time distributing its signal to a printed wiring device of considerably larger dimension.

Figure 2:
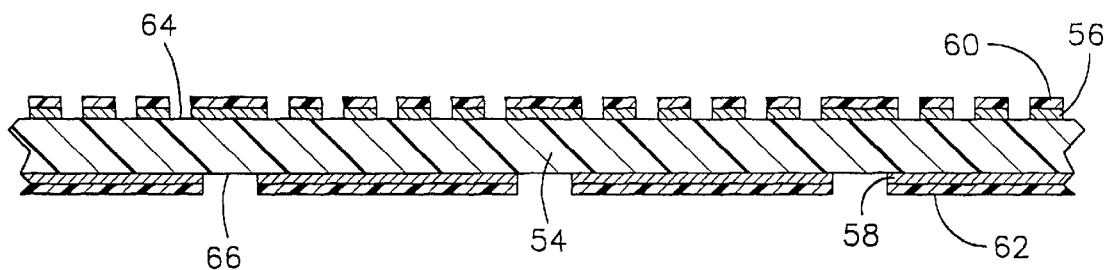
FIGS. 2 to 6 illustrate one process for manufacturing the inventive planer redistribution structure of FIG. 1.

FIGS. 2 to 6 illustrate one way of producing the inventive planar redistribution structure of FIG. 1. In the first step of this technique, as illustrated in FIG. 2, a fluoropolymer dielectric sheet 54 clad with continuous copper layers 56 and 58 is laminated on both sides with dry film resist layers 60 and 62, respectively. Next, dry film resist 60 is exposed to a pattern corresponding to input/output pads 34 and redistribution lines 36, while resist 62 is exposed to a pattern corresponding to via holes 42. Resists 60 and 62 are then developed to remove selected portions of the resist layers and then the copper layers 56 and 58 under these exposed areas are etched away with a suitable etchant to leave the structure illustrated in FIG. 2.

Next, lower major surface 66 of the dielectric sheet is subjected to laser ablation to form via holes 42 therein. Then resist layers 60 and 62 are stripped away to leave the structure illustrated in FIG. 3.

Figure 3:
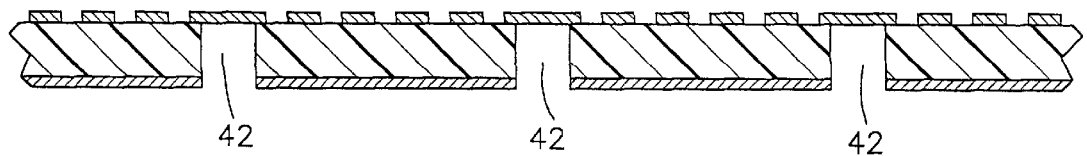
Figure 4:
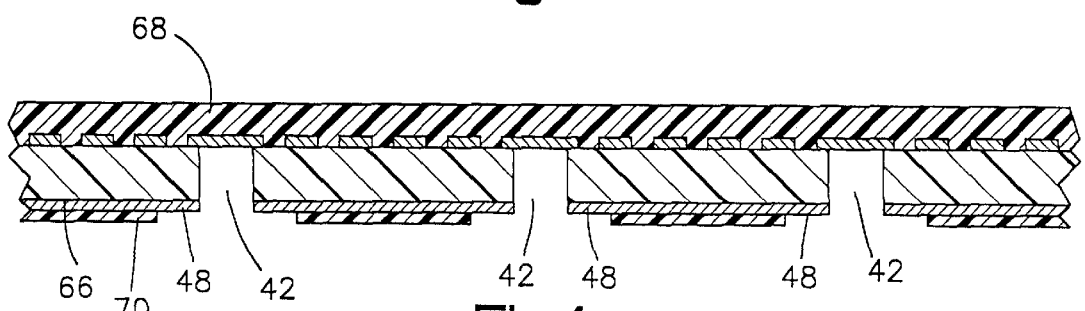

Next, all surfaces of the structure of FIG. 3 are treated with a metal deposition catalyst, followed by plating of thin layer of copper thereon such as by electrodeposition, for example. Then, a negative resist is electrodeposited on all surfaces of the structure and then negative dry film resist layers 68 and 70 are laminated on the upper and lower major surfaces of the dielectric sheet 54. Then, negative dry film resist 70 is exposed and developed in the areas defining joining patterns 49, 50 and 51 around via holes 42 to thereby produce the structure illustrated in FIG. 4.

Figure 5:
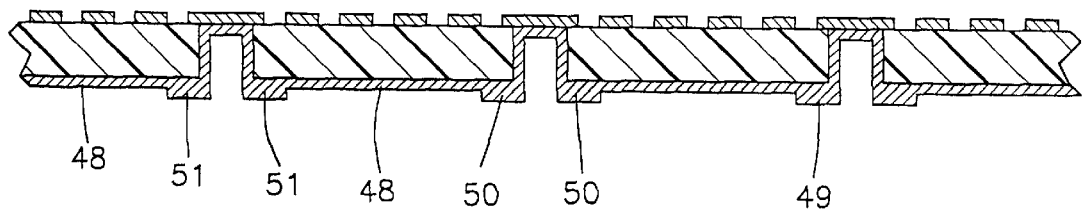
Figure 6:
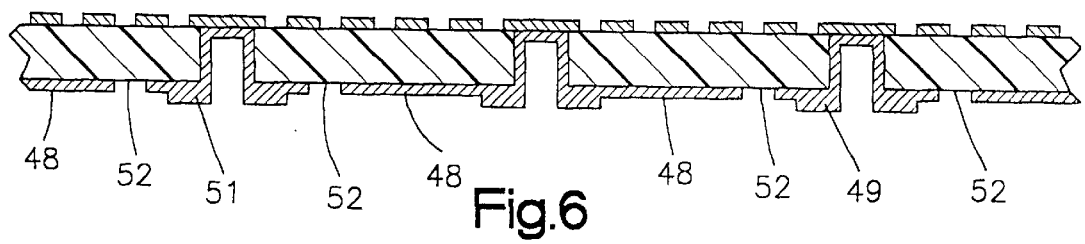

Via holes 42 including the surrounding areas of ground plane 48 are then electrolytically plated with copper followed by gold to thereby form joining patterns 49, 50 and 51, as illustrated in FIG. 5. Then, negative dry resist layers 68 and 70 are stripped off to form the structure illustrated in FIG. 5.

Finally, openings or breaks 52 for electrically insulating forming patterns 49 and 51 are formed in ground plane 48 by applying a dry film negative resist to both sides of the structure of FIG. 5 and exposing and developing the negative dry resist on lower major surface 66 in the pattern of these openings. The negative dry resist layers on both surfaces for electrically insulating forming patterns 49 and 51 are then stripped away and finally upper major surface 64 is flash-etched to remove the remaining thin layer of copper thereon in non-signal areas.

The inventive planar redistribution structure produced in accordance with the present invention, as well as a printed wiring device formed from this planar redistribution structure, have many advantages. For example, because the redistribution lines and input/output pads on the upper major surface of the inventive redistribution structure are coplanar, joining of the redistribution structure to flip chips is facilitated. Also, production of these lines and pads can be done very easily in the same processing step, for example by fine line lithography. Moreover, because of ground plane 48, the redistribution signal lines have excellent $Z_o$ control. Also, ground plane 48 provides excellent dimensional stability to the inventive redistribution structure.

Furthermore, separate fabrication of the two major surfaces of the inventive planar redistribution structure allows each surface to be tailor-made to match the device to which it will be attached, i.e. the semiconductor chip on one side and the multi-layer substrate on the other. The area array of the electrical contacts on the semiconductor chip, on the one hand, and the electrical contacts on multilayer substrate 14, on the other hand, have widely varying pitches. The inventive planar redistribution structure, even though it is very thin and easy to manufacture, can nonetheless connect these two devices very easily and securely.

A further advantage of the inventive planar redistribution structure resides in the fact that joining patterns 49, 50 and 51 can be made considerably larger in lateral dimension than input/output pads 34. This not only improves fabrication yield during parallel lamination with a printed wiring device but also provides for excellent electrical connection since the contacts at the printed wiring device are considerably bigger.

Finally, the fact that the inventive planar redistribution structure is separately made from the printed wiring device allows off-specification redistribution structures to be discarded before lamination to on-specification multi-layer substrates. This improves fabrication yields because off-specification redistribution structures can be identified and discarded before use.

In certain embodiments of the invention, it is desirable to employ planar redistribution structures with improved thermal expansion properties, i.e. superior coefficients of thermal expansion (CTE's). This may be accomplished in accordance with the present invention by using a copper-invar-copper (CIC) composite as the ground plane of the inventive planar redistribution structure. Such a planar redistribution structure can be made by the general procedure described above. However, a preferred procedure for making this redistribution structure is as follows:

A CIC-clad fluorocarbon polymer dielectric sheet is laminated one side (side-A) with a first dry film resist (DF-1) and on its other side (side-B) with a different dry film resist (DF-2), resists DF-1 and DF-2 being developed by different strippers. Next, patterns for the redistribution lines and input/output pads are exposed and developed on side-A, while patterns for the vias are exposed and developed on side-B. Then, both external copper and invar are etched from both side-A and side-B. The layer of copper in contact with the fluoropolymer dielectric is not etched at this point.

Next, directional etching techniques, for example fluid head etching tools, are used to fully etch away remaining copper from the via hole area on side-B. On side-A, however, the remaining copper layer is only partially etched, away in thickness from the non-signal areas.

Next, a negative resist is electrodeposited to both Side-A and Side-B, this resist also being developed by a different stripper from resists DF-1 and DF-2. This negative resist is applied to Side-A so as to cover all non-signal areas as well as the side walls of all signal lines. It is also applied to Side-B to cover the metal sidewalls surrounding the via hole area.

Next, resist DF-1 is stripped from the signal line patterns on side-A and then first the copper and then the invar thereunder are etched away. Then, copper is electrolytically pattern plated to the signal line patterns on side-A to a thickness comparable to the entire thickness of the CIC layer. If desired, a thin layer of barrier metal can also be applied to protect the plated copper from the etching process to be performed in the next step. Next, the electrodeposited negative resist is stripped from the non-signal areas and the copper thereon etched away, preferably using directional etching techniques (side-A). If a barrier metal is not used, the plated copper in the signal area will be slightly reduced in thickness during the etching of the thin copper in the non-signal areas. Also, if a barrier metal has been applied to the top of the signal lines, as indicated above in the preferred embodiment, this barrier metal is then flash etched away.

Next, vias or holes 42 are formed in the fluoropolymer dielectric sheet by laser ablation, using resist DF-2 and side-B CIC ground layer as the ablation mask. Then, resist DF-2 is stripped from side-B. After this step, the structure is processed in the same way as described above to plate the via holes and adjoining areas with metal to form plated-through-holes and joining patterns followed by forming breaks 52 for isolating the power joining patterns and the signal joining patterns. Of course, in forming breaks 52, copper, then invar, then copper must be etched away from the structure to form these rings.

A completed device formed in this manner is essentially the same as the device illustrated in FIG. 1 in terms of structure, except that ground plane 48 is formed from a CIC composite. Because the thermal expansion characteristics of a CIC composite are more closely matched to that of the integrated circuit chip to be mounted to the completed structure at a later time, the planar redistribution structure formed in this manner can accommodate even greater amounts of thermal stress than the structure illustrated in FIG. 1.

Although only a few embodiments of the invention have been described above, it should be appreciated that many modifications can be made without departing from the spirit and scope of the invention. For example, materials other than fluorocarbon polymer and copper can be used for forming dielectric layer 28 and the metal elements of the inventive redistribution structure. In this regard, the above noted Alpaugh et al. Patent, U.S. Pat. No. 5,418,689, indicates that many different materials are useful in forming printed wiring devices and planar redistribution structures. The inventive planar redistribution structure, as well as the inventive printed wiring device made therefrom, can be made from any of these materials. Also, via holes 42 can be formed in dielectric 28 by means other than $CO_2$ laser, e.g., by plasma etching using the copper layer 48 as an etching mask, or, if material 28 is photosensitive, by using copper layer 48 as a photomask. Furthermore, although the foregoing description has indicated that multi-layer substrate 14 is composed of, two signal layers and one power plane or core, multi-layer substrates of other designs can also be used. For example, the present invention finds particular applicability in manufacturing printed wiring devices from 2S3P multi-layer substrates as well. It should be appreciated that the invention is applicable for use with printed wiring devices of any structure.

All such modifications are intended to be included within the scope of the present invention, which is to be limited only by the following claims.

We claim:

1. A process for making a redistribution structure, said redistribution structure being adapted for carrying at least one semiconductor chip and for subsequent lamination to a multilayer electronic substrate thereby forming a printed wiring device, said process comprising:

forming a plurality of signal redistribution lines for electrical connection to said semiconductor chip on the upper major surface of a dielectric layer having an upper major surface and a lower major surface, forming a plurality of input/output pads on said upper major surface, said input/output pads being in electrical contact with selected ones of said signal redistribution lines, forming a ground plane on the lower major surface of said dielectric layer, with openings underlying the input/output pads on said upper surface, thereafter forming a plurality of vias extending between said upper and lower major surfaces, each of said vias underlying and completely covered by and communicating with one of said input/output pads, said vias being formed by laser ablation of said dielectric layer from a laser irradiating said dielectric layer through the lower major surface thereof at the openings in the ground plane;

and providing conducting material in said vias.

2. The process of claim 1, further comprising forming a plurality of joining patterns on the lower major surface of said dielectric layer, said joining patterns communicating with respective vias in said dielectric layer, at least one of said joining patterns being in electrical communication with said ground plane, and at least one other joining pattern being electrically insulated from said ground plane.

3. The process of claim 2, wherein said joining patterns are formed by depositing a metal on said ground plane in patterns corresponding to the shapes of said joining patterns, said metal also being deposited on the interior walls of said vias during formation of said joining patterns so that said vias are formed into plated-through-holes, the metal in said plated-through-holes being in electrical contact with the input/output pads on the upper surface of said dielectric layer, the tops of said plated-through-holes being defined by said input/output pads whereby the tops of said plated-through-holes define an even topography with said redistribution lines at the upper surface of said dielectric layer.

4. The process of claim 3, wherein said input/output pads and said signal redistribution lines are substantially the same height whereby the upper surfaces of said signal redistribution lines and said input/output pads are essentially coplanar.

5. The process of claim 4, wherein said redistribution lines and said input/output pads are formed during the same formation step.

6. The process of claim 5, wherein said redistribution lines and said input/output lines are formed by fine line lithography.

7. The process of claim 6, wherein said joining patterns are larger in lateral dimension than said input/output pads.

8. The process of claim 7, wherein said semiconductor chip defines contact bumps for electrical connection with the signal redistribution lines of said redistribution structure, the center-to-center pitch of said vias being at least twice as great as the pitch between said contact bumps.

9. The process of claim 1, wheren said joining patterns are formed by depositing a metal on the lower major surface of said dielectric layer in patterns corresponding to the shapes of said joining patterns, said metal also being deposited on the interior walls of said vias during formation of said joining patterns so that said vias are formed into plated-through-holes, the metal in said plated-through-holes being in electrical contact with the input/output pads on the upper surface of said dielectric layer, the tops of said plated-through-holes being defined by said input/output pads whereby the tops of said plated-through-holes define an even topography with said redistribution lines at the upper surface of said dielectric layer.

10. A process for making a printed wiring device comprising laminating a redistribution structure comprising:

a fluoropolymer-based dielectric sheet having a top surface and a bottom surface; said top surface comprising signal redistribution lines and input/output pads, said lines and pads being substantially the same height;

said bottom surface comprising a ground plane and joining patterns for signal, power and ground connections onto a multilayer electronic substrate, said multilayer substrate comprising at least one power core and at least one signal layer joined thereto.

11. The process of claim 10, wherein said multilayer substrate comprises two signal layers and one power plane laminated to one another.

12. The process of claim 10, wherein said multilayer substrate comprises two signal layers and three power planes laminated to one another.

13. The process of claim 10, wherein said redistribution structure is tested to determine if it meets specifications prior to being laminated to said multilayer substrate.

* * * * *